United States Patent
Liang et al.

(10) Patent No.: US 8,658,440 B2
(45) Date of Patent: Feb. 25, 2014

(54) NITRIDE SEMICONDUCTOR CRYSTAL WITH SURFACE TEXTURE

(75) Inventors: Ji-Hao Liang, Kawasaki (JP); Masahiko Tsuchiya, Kamakura (JP); Takako Chinone, Tokyo (JP); Masataka Kajikawa, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 42 days.

(21) Appl. No.: 13/311,644

(22) Filed: Dec. 6, 2011

(65) Prior Publication Data

US 2012/0077298 A1 Mar. 29, 2012

Related U.S. Application Data

(62) Division of application No. 11/843,916, filed on Aug. 23, 2007, now Pat. No. 8,158,993.

(30) Foreign Application Priority Data

Aug. 28, 2006 (JP) ................. 2006-230484

(51) Int. Cl.
*H01L 21/00* (2006.01)
*H01L 33/00* (2010.01)

(52) U.S. Cl.
USPC ............ 438/22; 438/758; 438/942; 438/948; 257/79; 257/95; 257/E33.008; 257/E33.028; 257/E21.023

(58) Field of Classification Search
USPC ........ 257/79, 89, 95, 103, E33.001, E33.005, 257/E33.008, E33.025, E33.028, E21.023, 257/E21.024, E21.025, E21.027, E21.028; 438/22, 758, 759, 942, 948
See application file for complete search history.

(56) References Cited

U.S. PATENT DOCUMENTS

| 6,461,944 B2 | 10/2002 | Neudeck et al. |
| 6,569,704 B1 | 5/2003 | Takeuchi et al. |
| 6,620,238 B2 * | 9/2003 | Tsuda et al. ............ 117/90 |

(Continued)

FOREIGN PATENT DOCUMENTS

| EP | 1 551 064 A2 | 7/2005 | |
| GB | 241532 A2 * | 3/2006 | ............. H01L 33/00 |

(Continued)

OTHER PUBLICATIONS

Quirk et al. Semiconductor Manufacturing Technology. 2001. Prentice Hall, pp. 348-349.* Spak et al. Mechanism and Lithographic Evaluation of Image Reversal in AZ 5214 Photoresist. Seventh International Technical Conference on Photopolymers, New York, 2000, pp. 9-16.*

(Continued)

*Primary Examiner* — Cuong Q Nguyen
*Assistant Examiner* — Galina Yushina
(74) *Attorney, Agent, or Firm* — Holtz, Holtz, Goodman & Chick, PC

(57) ABSTRACT

A nitride semiconductor light emitting device is formed by: forming a resist pattern on a first nitride semiconductor layer formed on a substrate, the resist pattern having a region whose inclination angle relative to a substrate surface changes smoothly as viewed in a cross section perpendicular to the substrate surface; etching the substrate by using the resist pattern as a mask to transfer the resist pattern to the first nitride semiconductor layer; and forming an light emitting layer on the patterned first nitride semiconductor layer. The nitride semiconductor light emitting device can emit near-white light or have a wavelength range generally equivalent to or near visible light range.

10 Claims, 6 Drawing Sheets

(56) References Cited

U.S. PATENT DOCUMENTS

| | | |
|---|---|---|
| 8,227,820 B2 * | 7/2012 | Sharma et al. .............. 257/95 |
| 2002/0084467 A1 | 7/2002 | Krames et al. |
| 2002/0145148 A1 | 10/2002 | Okuyama et al. |
| 2003/0057444 A1 | 3/2003 | Niki et al. |
| 2003/0062530 A1 * | 4/2003 | Okazaki et al. .............. 257/79 |
| 2004/0048471 A1 | 3/2004 | Okagawa et al. |
| 2005/0045894 A1 | 3/2005 | Okuyama et al. |
| 2005/0064206 A1 | 3/2005 | Akita et al. |
| 2005/0082544 A1 * | 4/2005 | Narukawa et al. .............. 257/79 |
| 2005/0145862 A1 | 7/2005 | Kim et al. |
| 2005/0205884 A1 | 9/2005 | Kim et al. |
| 2005/0285132 A1 | 12/2005 | Orita |
| 2006/0175624 A1 | 8/2006 | Sharma et al. |
| 2006/0237735 A1 | 10/2006 | Naulin et al. |

FOREIGN PATENT DOCUMENTS

| | | |
|---|---|---|
| JP | 11-289108 A | 10/1999 |
| JP | 2000-286506 A | 10/2000 |
| JP | 2003-101156 A | 4/2003 |

OTHER PUBLICATIONS

Quirk, Semiconductor Manufacturing Technology, Chapter 14, pp. 387-390.*

Haskell et al, "Microstructure and Enhanced Morphology of Planar Nonpolar m-Plane GaN Grown by Hydrite Vapor Phase Epitaxy," Journal of Electronic Materials, vol. 34., No. 4, 2005, pp. 357-360.

Hahn et al, "High-density plasma-induced etch damage of InGaN/GaN multiple quantum well light-emitting diodes," Journal of Applied Physics, vol. 92, No. 3, 2002, pp. 1189-1194.

Smeeton et al, "Atomic force microscopy analysis of cleaved facets in III-nitride laser diodes grown on free-standing GaN substrates," Applied Physics Letters, 98, 2006, pp. 041910-1041910-3.

Ng et al, "Patterning GaN Microstructures by Polarity-Selective Chemical Etching," Jpn. J. Appl Phys., vol. 42, No. 12A, 2003, pp. L1405-L1407.

Chitnis et al, "Visible light-emitting diodes using a-plane GaN—InGaN multiple quantum wells over r-plane substrate," Applied Physics Letters, vol. 84, No. 18, 2004, pp. 3663-3665.

European Search Report dated Feb. 15, 2011, issued in counterpart European Application No. 07016102.

* cited by examiner

NITRIDE SEMICONDUCTOR CRYSTAL WITH SURFACE TEXTURE

CROSS REFERENCE TO RELATED APPLICATION

This is a Divisional of U.S. application Ser. No. 11/843,916, filed Aug. 23, 2007, now U.S. Pat. No. 8,158,993 which is based upon and claims the benefit of priority from Japanese Patent Application No. 2006-230484, filed Aug. 28, 2006, the entire contents of both of which are incorporated herein by reference.

BACKGROUND OF THE INVENTION

A) Field of the Invention

The present invention relates to semiconductor crystal, a light emitting device using the semiconductor crystal, and its manufacture method, and more particularly to nitride semiconductor crystal, a light emitting device using the semiconductor crystal, and its manufacture method. Nitride semiconductor is intended to mean semiconductor including mixed crystal represented by a composition formula of $Al_xGa_yIn_{(1-x-y)}N$ and containing gallium nitride (GaN) as its main component and optional aluminum (AL) and indium (In) substituting for Ga.

B) Description of the Related Art

Although the performance of a light emitting diode (LED) has improved recently and its application field is broadened, the performance is desired to be improved further. The performance of a semiconductor light emitting device particularly emitting white light, is desired to be improved.

Various proposals have been made. For example, phosphor-containing resin may seal a package mounting a blue LED. Phosphor is excited by blue light to obtain pseudo white light. Alternatively, LED's of three primary colors, R (red), green (G) and blue (B), may be mounted in a package to obtain white light. When phosphor is used, there is a process of mixing phosphor in resin. If monochromatic LED's are used, mounting process becomes complicated. A white LED with simplified structure which can be manufactured through simplified process is desired.

JP-HEI-A-11-289108, which is herein incorporated by reference in its entirety, has proposed a gallium nitride based compound semiconductor light emitting device in which indium (In) is added in light emitting layer in varied composition to broaden a light emission wavelength range and emit near-white light.

JP-A-2000-286506, which is herein incorporated by reference in its entirety, has proposed a GaN based light emitting device in which a V groove is formed and then GaNAs or GaNP active layer is grown thereon to emit light having a plurality of wavelengths, enabling generation of near-white light through color mixture.

JP-A-2003-101156, which is herein incorporated by reference in its entirety, has proposed a GaN based light emitting device in which a plurality of nitride semiconductor layers having inclination angles are formed on a substrate to emit light having a plurality of wavelengths, enabling generation of near-white light through color mixture.

It is desired to realize a light emitting device capable of emitting white light having good color rendering and a light emitting device having an emission wavelength range equivalent to or near visible light range.

SUMMARY OF THE INVENTION

It is an object of the present invention to provide a nitride semiconductor light emitting device capable of emitting near-white light or providing an emission wavelength range equivalent to or near visible light range.

According to one aspect of the present invention, there is provided a method for manufacturing a nitride semiconductor light emitting device, comprising the steps of: (a) forming a resist pattern on a first nitride semiconductor layer formed above a substrate, said resist pattern having a region whose inclination angle of an upper surface relative to a substrate surface changes smoothly as viewed in a cross section perpendicular to the substrate surface; (b) etching said substrate by using said resist pattern as a mask to transfer said resist pattern to said first nitride semiconductor layer; and (c) forming an active layer on said patterned first nitride semiconductor layer.

According to another aspect of the present invention, there is provided a method for manufacturing a nitride semiconductor crystal, comprising the steps of: (a) forming a resist pattern on a first nitride semiconductor layer formed above a substrate, said resist pattern having a region whose inclination angle of an upper surface relative to a substrate surface changes smoothly as viewed in a cross section perpendicular to the substrate surface; (b) etching said substrate by using said resist pattern as a mask to transfer said resist pattern to said first nitride semiconductor layer; and (c) forming an active layer on said patterned first nitride semiconductor layer.

According to another aspect of the present invention, there is provided a nitride semiconductor light emitting device comprising: a substrate; and an active layer stacked above said substrate and having a surface including a region whose inclination angle relative to a substrate surface changes smoothly as viewed in a cross section perpendicular to the substrate surface.

According to another aspect of the present invention, there is provided a nitride semiconductor crystal comprising: a substrate; and an active layer stacked above said substrate and having a surface including a region whose inclination angle relative to a substrate surface changes smoothly as viewed in a cross section perpendicular to the substrate surface.

DESCRIPTION OF THE PREFERRED EMBODIMENTS

With reference to FIGS. 1A to 1F, description will be made on method for manufacturing a light emitting device using nitride semiconductor crystal, according to the first embodiment.

Sapphire or the like is generally used as the material of a substrate 1 on which a nitride semiconductor layer is to be grown. In this embodiment, a 2-inch sapphire substrate is used. Materials SiC, $Ga_2O_3$, ZnO or the like may also be used as the substrate. A thickness of the substrate 1 is, for example, 430 μm, and one surface of the substrate is polished.

The substrate 1 is first introduced into a metal organic chemical vapor deposition (MOCVD) system. The substrate 1 is heated to 1000° C. and left in a hydrogen atmosphere for 7 minutes to thereby conduct so-called thermal cleaning which removes oxygen molecules, OH radicals and the like attached to the surface of the substrate 1.

Figure 1A:
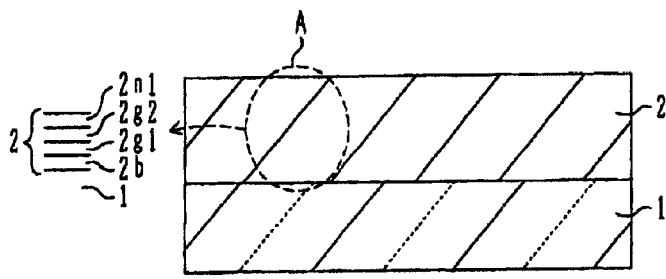
FIG. 1A to 1F are schematic cross sectional views illustrating a manufacture method for a nitride semiconductor light emitting device according to a first embodiment.

As shown in FIG. 1A, after the thermal cleaning, a first nitride semiconductor layer 2 is grown on the substrate 1. For example, GaN is used as the material of the first nitride semiconductor layer. More specifically, a buffer layer is formed on the substrate 1 to improve crystallinity of GaN. A buffer layer of initially low crystallinity and amorphous-like phase is growing by supplying trimethylgallium (TMG) at 10.4 μmol/min and ammonium ($NH_3$) at 3.3 LM (liter per minute at 25° C., one atmospheric pressure) in an atmosphere of mixed hydrogen and nitrogen on a substrate at a temperature of 525° C., for 3 minutes.

Next, the first GaN layer not doped with impurities is formed by suppressing growth speed. The first GaN layer is grown to a thickness of 0.3 μm by supplying TMG at 23 μmol/min and $NH_3$ at 2.2 LM in an atmosphere of mixed hydrogen and nitrogen on a substrate at a temperature of 1000° C., for 15 minutes.

By increasing the growth speed, the second GaN layer not doped with impurities is formed. The second GaN layer is grown to a thickness of 2 μm by supplying TMG at 45 μmol/min and $NH_3$ at 4.4 LM in an atmosphere of mixed hydrogen and nitrogen and on a substrate at a temperature of 1000° C., for 43 minutes.

The first n-type GaN layer doped with silicon (Si) is further grown. The first n-type GaN layer is grown to a thickness of 3.5 μm by supplying TMG at 45 μmol/min, $NH_3$ at 4.4 LM and $SiH_4$ as silicon source at 2.7 nmol/min in an atmosphere of mixed hydrogen and nitrogen on a substrate at a temperature of 1000° C., for 77 minutes. A molecule (atom) ratio Si/TMG of doped Si to TMG is 6E-5 ($6 \times 10^{-5}$, $a \times 10^n$ is denoted by aEn). With these processes, the first nitride semiconductor layer 2 is formed.

Lamination structure of portion A surrounded by a broken line is shown to the left of FIG. 1A. As shown, the first nitride semiconductor layer 2 has a lamination structure of the buffer layer 2b, the first GaN layer 2g1, the second GaN layer 2g2 and the first n-type GaN layer 2n1 stacked in this order.

After the first nitride semiconductor layer 2 is formed, the substrate 1 stacked with the first nitride semiconductor layer 2 is once unloaded from the MOCVD system. The unloading process of the substrate 1 is in the following manner. First, after a supply of TMG is stopped, the substrate temperature is lowered at a temperature fall rate of 200° C./min while $NH_3$ is supplied at 4.4 LM in an atmosphere of mixed hydrogen and nitrogen. Supply of $NH_3$ is stopped at a substrate temperature of 500° C., and then the substrate 1 is taken out of the reaction chamber at a substrate temperature of 150° C. to 250° C.

A resist pattern will be formed on the first nitride semiconductor layer. More specifically, the substrate 1 is cleaned with acetone or isopropyl alcohol (IPA) by using an ultrasonic wave cleaner.

Figure 1B:
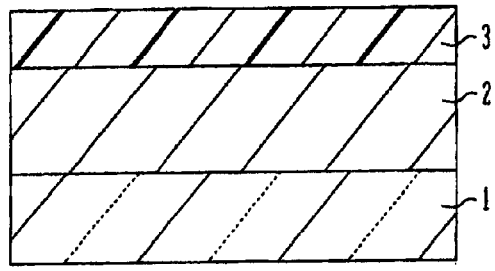

As shown in FIG. 1B, a photoresist layer 3 is spin-coated on the nitride semiconductor layer 2. In this example, an AZ5214 negative type resist layer is spin-coated on the substrate at 6000 rpm. A thickness of the resist layer is about 1 μm. Thereafter, the photoresist layer is pre-baked at 90° C. for 60 seconds, and then the photoresist layer 3 is patterned.

Figure 2A:
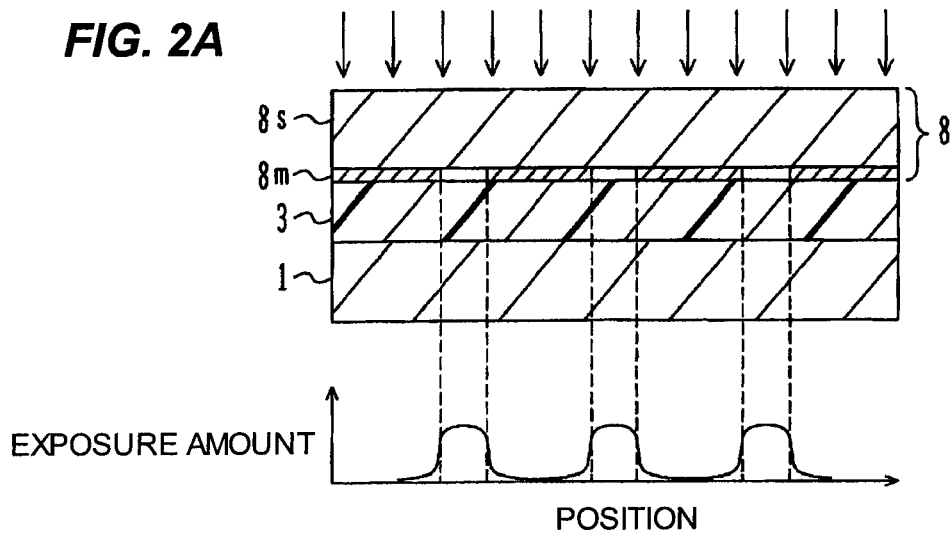
FIG. 2A is a schematic cross sectional view illustrating lithography process in which a resist layer formed on a first nitride semiconductor layer is exposed by contact exposure.
Figure 2B:
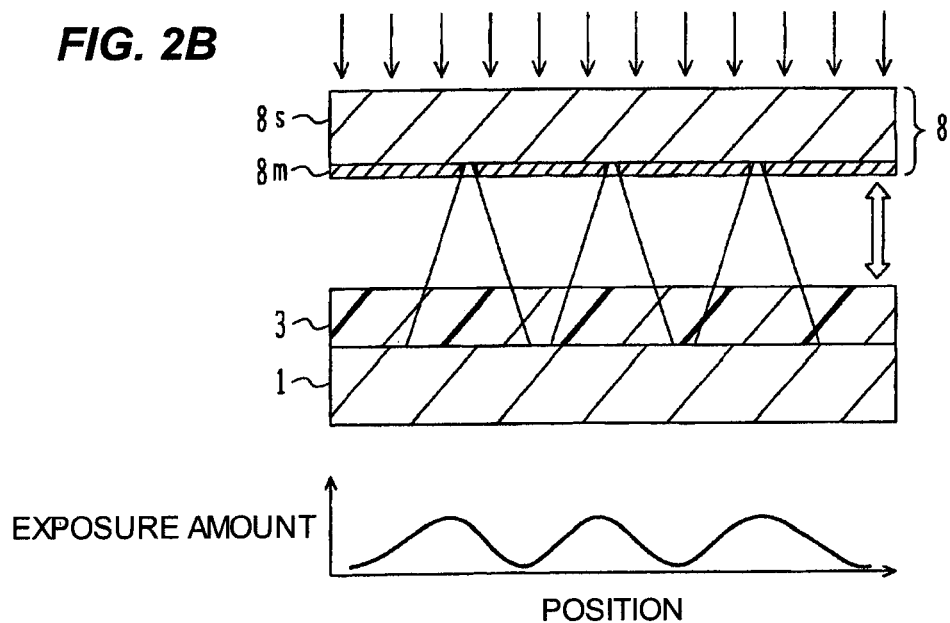
FIG. 2B is a schematic cross sectional view illustrating lithography process in which a resist layer formed on the first nitride semiconductor layer is exposed by proximity exposure.

FIGS. 2A and 2B illustrate two types of patterning process for the photoresist layer 3. As shown in FIGS. 2A and 2B, the photoresist is patterned by exposure and development.

Description will be made on a contact exposure patterning shown in FIG. 2A. A mask 8 is constituted of a mask substrate 8s and a metal pattern 8m having a predetermined pattern and formed on the lower surface of the mask substrate. The mask 8 is disposed by contacting the metal pattern 8m on the photoresist layer 3.

Figure 3:
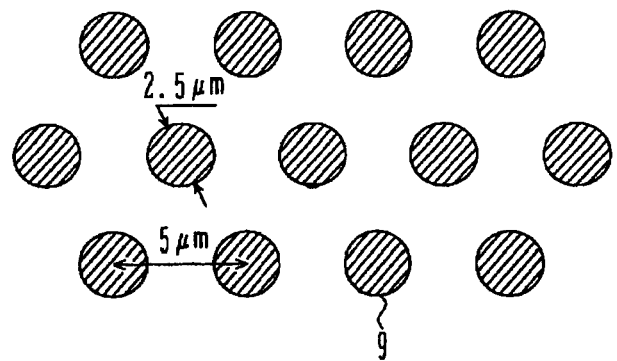
FIG. 3 is a plan view showing an example of a mask pattern.

FIG. 3 is a plan view showing an example of the metal pattern 8m of the mask 8. As shown, the mask pattern has circular dots (openings) 9 having a diameter of 2.5 μm and disposed in close-packed structure (in this example, in hexagonal close-packed configuration). A distance between adjacent dots is 5 μm. Ultraviolet (UV) rays are irradiated to the mask substrate at an exposure energy amount of 50 mJ/cm². Light passed through the dots 9 is applied to the resist. Development is performed thereafter for 60 seconds at a room temperature by using AZ-Developer as development liquid. Since a negative type resist is used in this embodiment, the resist applied with light is left after development.

As shown in the lowest portion of FIG. 2A, light is also applied to some extent to the neighboring outer area of each dot as viewed in plan, and each dot pattern has a protrusion sharply rising in the dot area and gradually lowering at its skirt portion in the outer area.

As shown in FIG. 2B, the exposure may also be done by proximity exposure with a gap provided between the mask 8 and the photoresist layer 3. Provision of a gap between the mask and the photoresist layer enhances spreading of light. As shown in the lowest portion of FIG. 2B, the width of each spot becomes large, and may overlap an adjacent spot at the skirt. Development is carried out in a similar manner as above.

Figure 1C:
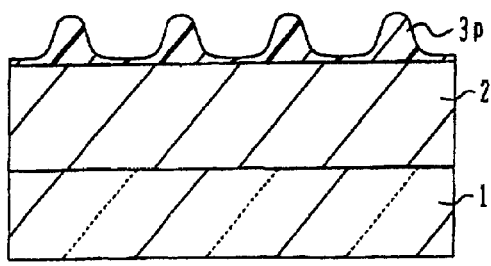

As shown in FIG. 1C, the resist layer is exposed and developed to form a resist pattern 3p. Post-baking is performed at 120° C. for 120 seconds to stabilize the resist pattern 3p.

Figure 1D:
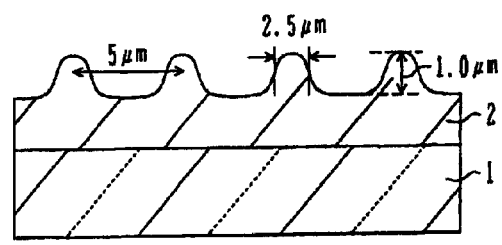

As shown in FIG. 1D, the first nitride semiconductor layer is dry-etched using the resist pattern 3p as a mask, by inductively coupled plasma (ICP). For example, the dry etching is performed using $Cl_2$ gas under the conditions of pressure of 1 Pa, RF frequency of 13.56 MHz and power of 100 W. Etching selectivity between the resist and first nitride semiconductor layer 2 is 1:1, and etching depth of the first nitride semiconductor layer 2 is about 1.0 μm. The projections may be distributed at a pitch of 5 μm. Each projection may have a width (FWHM) of about 2.5 μm. A patterned surface texture is thus formed in the first nitride semiconductor layer 2.

Figure 4A:
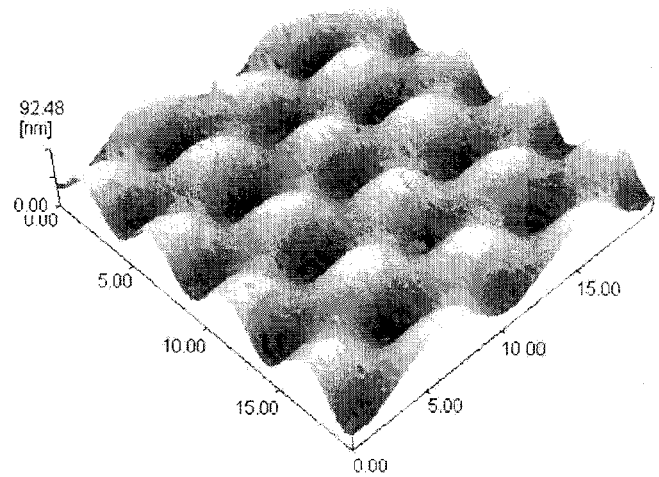
FIGS. 4A to 4C show AFM images obtained from surface pattern examples of the first nitride semiconductor layer according to the embodiment.
Figure 4B:
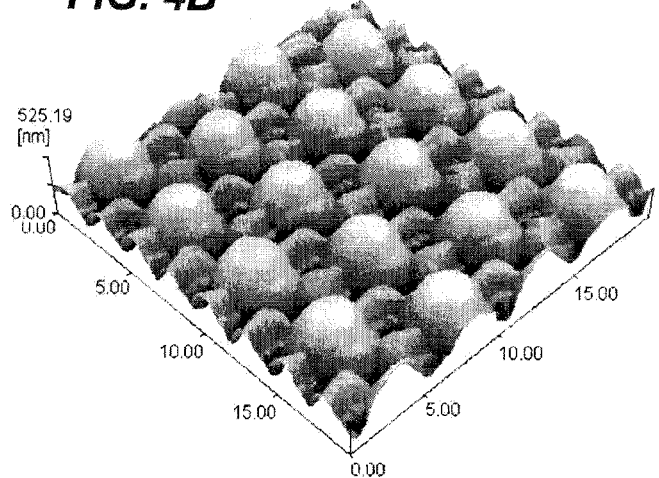
Figure 4C:
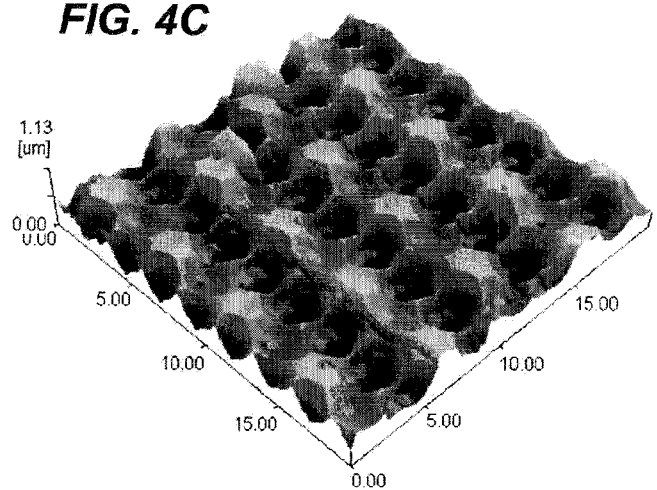

FIGS. 4A to 4C show AFM images picked up with an atomic force microscope (AFM) showing examples of surface texture of the patterned first nitride semiconductor layer 2.

As shown in FIG. 4A, as the first nitride semiconductor layer 2 is patterned by the above-described process, the obtained surface texture has projections in close-packed hexagonal configuration. Each projection has a smoothly changing inclination angle between an upper surface of the layer 2 and the substrate surface in a cross section perpendicular to the substrate.

By adjusting the exposure amount or changing the exposure process such as to the proximity exposure, it is possible to form a pattern having a plurality of types of projections having different heights such as shown in FIG. 4B or a texture having concave portions in close-packed hexagonal configuration. Each concave portion in FIG. 4C includes an area which has a smoothly changing inclination angle between an upper surface of the layer 2 and the substrate surface in a cross section perpendicular to the substrate.

Figure 5:
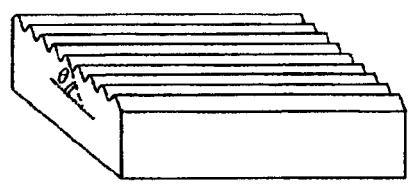
FIG. 5 is a perspective view showing another surface pattern of the first nitride semiconductor layer.

FIG. 5 is a perspective view showing another surface texture of the first semiconductor layer 2. As shown in FIG. 5, the surface texture of the first nitride semiconductor layer 2 may include one or a plurality of rib-like stripe projections.

As described above, by adjusting the mask pattern and exposure conditions, the first nitride semiconductor layers 2 can be provided with various surface textures which have a smoothly changing inclination angle relative to the substrate surface. An inclination angle of surface texture is preferably in a range of 0° to 30° from the viewpoint of practical use.

Processes will further be described reverting to FIGS. 1A to 1F. The substrate 1 stacked with the nitride semiconductor layer is subjected to an acid treatment and organic cleaning process. The acid treatment uses aqua regia, hydrogen peroxide sulfate, hydrogen peroxide hydrochloride or the like, the organic cleaning uses a combination of acetone or IPA and ultrasonic waves.

The substrate 1 is again introduced into the MOCVD system, and a substrate temperature is raised to 1000° C. while $NH_3$ is supplied at 4.4 ML.

Figure 1E:
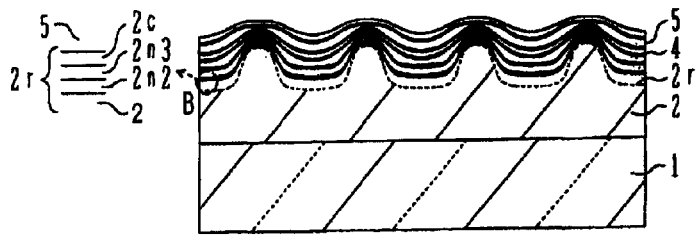

As shown in FIG. 1E, a nitride semiconductor layer (re-grown layer) 2r is deposited on the first nitride semiconductor layer 2. First, the second n-type GaN layer doped with Si is grown. The second n-type GaN layer is grown to a thickness of 0.2 μm by supplying TMG at 45 μmol/min, $NH_3$ at 4.4 LM and $SiH_4$ as Si source at 0.46 nmol/min in an atmosphere of mixed hydrogen and nitrogen at a substrate temperature of 1000° C. A molecular (atomic) ratio of doped Si to TMG (Si/TMG) is 1 E-5.

Next, the third n-type GaN layer doped with Si is grown. The third n-type GaN layer is grown by supplying TMG at 23 μmol/min, $NH_3$ at 4.4 LM and $SiH_4$ as Si source at 0.23 nmol/min in an atmosphere of mixed hydrogen and nitrogen while lowering a substrate temperature to 720° C. in 4 minutes. A molecular (atomic) ratio of doped Si to TMG (Si/TMG) is 1E-5.

Next, an n-type AlGaN layer 2c as a clad layer is grown on the third n-type GaN layer. With these processes, the re-grown layer 2r is formed.

Layer structure of a portion B surrounded by a broken line is shown at the left to FIG. 1E. As shown, the re-grown layer 2r has a lamination structure of the second n-type GaN layer 2n2, the third n-type GaN layer 2n3, and the n-type AlGaN layer 2c stacked in this order.

As shown in FIG. 1E, a light emission layer is formed on the re-grown layer 2r. In this example, a multiple quantum well (MQW) layer is formed. Indium gallium nitride (InGaN) layers as a well layer 4 and GaN layers doped with Si as a barrier layer 5 are alternately grown.

In order to form the well layer 4, an InGaN layer is grown by supplying TMG at 3.6 μmol/min, trimethylindium (TMI) at 20 μmol/min and $NH_3$ at 4.4 LM in a nitrogen atmosphere under the conditions of a substrate temperature of 710° C. and a growth time of 41 seconds.

In order to form the barrier layer, a GaN layer is grown by supplying TMG at 3.6 μmol/min, $NH_3$ at 4.4 LM and $SiH_4$ as Si source at 0.016 nmol/min in a nitrogen atmosphere under the conditions of a substrate temperature of 710° C. and a growth time of 320 seconds. A molecular (atomic) ratio of doped Si to TMG (Si/TMG) is 4.5E-6.

In this embodiment, five quantum well layers in total are formed by alternately growing the well layer and GaN layer (the lowest layer is the well layer). In this manner, the light emitting layer is formed.

As shown in FIG. 1E, in the light emitting layer of five quantum well layers, an inclination angel change becomes steeper at the lower layer. The upper layer has a gentler inclination angle. The light emission wavelength can be broadened by the light emitting layer having such an inclination angle distribution.

Figure 1F:
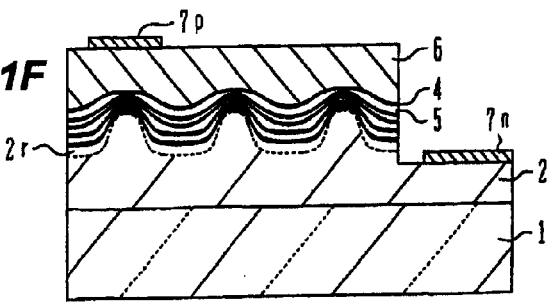

As shown in FIG. 1F, a second nitride semiconductor layer 6 is grown in the following manner. First, a p-type aluminum gallium nitride (AlGaN) layer doped with magnesium (Mg) is grown. The p-type AlGaN layer is grown to a thickness of 40 nm by supplying TMG at 8.1 μmol/min, trimethylaluminum (TMA) at 7.56 μmol/min, $NH_3$ at 4.4 LM and $Cp_2Mg$ as Mg source at 0.149 μmol/min in an atmosphere of mixed hydrogen and nitrogen under the conditions of a substrate temperature of 870° C. and a growth time of 5 minutes. A molecular (atomic) ratio of doped Mg to TMG (Mg/TMG) is 0.0184.

Next, a first p-type GaN layer doped with Mg is grown. The first p-type GaN layer is grown to a thickness of 100 nm by supplying TMG at 18 μmol/min, $NH_3$ at 4.4 LM and $Cp_2Mg$ as Mg source at 0.198 μmol/min in an atmosphere of mixed hydrogen and nitrogen under the conditions of a substrate temperature of 870° C. and a growth time of 4 minutes. A molecule (atom) ratio (Mg/TMG) of doped Mg to TMG is 0.011.

Next, a second p-type GaN layer having an Mg dose larger than that of the first p-type GaN layer is grown. The second p-type GaN layer is grown to a thickness of 50 nm by supplying TMG at 18 μmol/min, $NH_3$ at 4.4 LM and $Cp_2Mg$ as Mg source at 0.234 μmol/min in an atmosphere of mixed hydrogen and nitrogen under the conditions of a substrate temperature of 870° C. and a growth time of 2 minutes. A molecular (atomic) ratio of doped Mg to TMG (Mg/TMG) is 0.013. With these processes, the second nitride semiconductor layer 6 is formed.

As shown in FIGS. 1E and 1F, an active layer including the laminated light emitting layers, a portion of the first nitride semiconductor layer 2 and a portion of the second nitride semiconductor layer 6 has different inclination angles at respective layers in the active layer, as viewed in a cross section perpendicular to the substrate surface. The inclination angle becomes gentler at the upper layer. It is therefore possible that the light emitting layer has a broad inclination angle distribution.

Next, heat treatment is performed to activate doped impurities in a nitrogen atmosphere at 850° C. for one minute.

As shown in FIG. 1F, an n-type electrode 7n and a p-type electrode 7p are formed in the following manner. First, the second nitride semiconductor layer 6, light emitting layer and a portion of the first nitride semiconductor layer 2 are removed by dry etching starting from the second nitride semiconductor layer 6 side. As an etching mask, a resist pattern or a metal film is generally used, and chlorine containing gas is used as etching gas. An etcher is an ICP dry etching system. A parallel plate dry etching system may also be used.

The n-type electrode 7n is formed being electrically connected to the exposed first nitride semiconductor layer 2.

The p-type electrode 7p is formed on and electrically connected to the second nitride semiconductor layer 6.

The electrodes are formed of metals which have a high conductivity and are relatively inexpensive and durable. For example, Ti/Al is used for the n-type electrode 7n, and Ni/Au is used for the p-type electrode 7p.

Lastly, the substrate is separated into chips by scribing and cleaving to complete the nitride semiconductor light emitting device of the embodiment.

Figure 6:
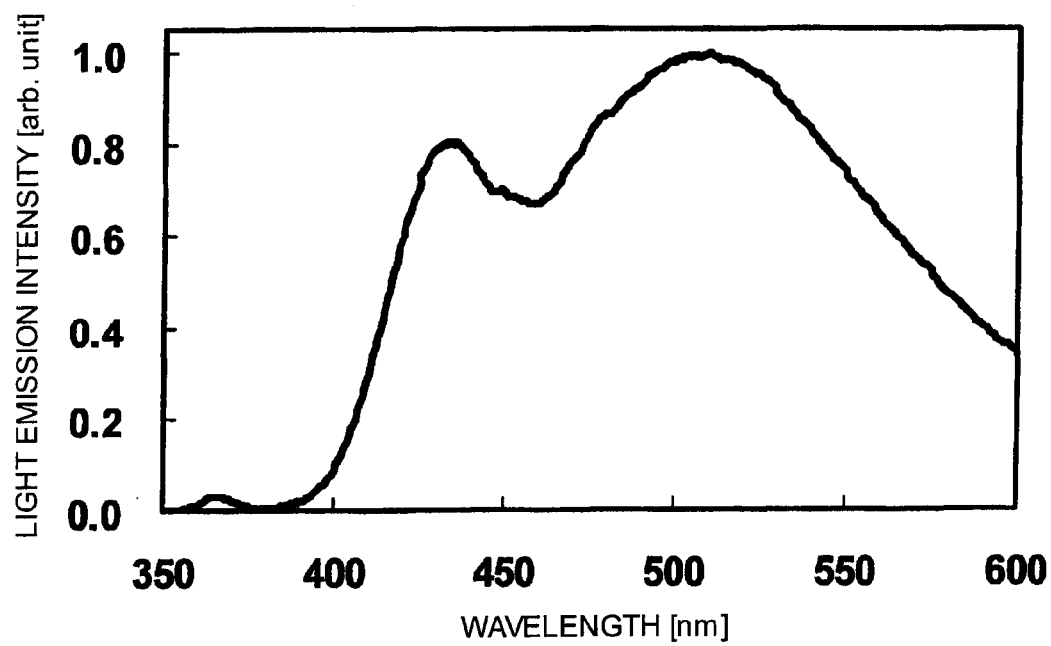
FIG. 6 is an emission spectrum of a light emitting layer excited by a He—Cd laser.

FIG. 6 shows an emission spectrum of the light emitting layer of a nitride semiconductor light emitting device having the surface texture in the active layer shown in FIG. 4A. Nitride semiconductor in a wafer state was excited with an excitation light source of He—Cd laser (325 nm) of 2 mW and 2.5 mm diameter, and optical emission from the semiconductor was measured with a spectrophotometer.

As shown in FIG. 6, optical emission was observed in a wide wavelength range, with a full width at half maximum (FWHM) being 168 nm. A full width at half maximum (FWHM) of an optical emission spectrum of a reference sample (optical emission peak wavelength of 498 nm) was 28 nm. The reference sample has a flat active layer and the same composition as that of the embodiment nitride semiconductor light emitting device. The optical emission FWHM of the embodiment device is about a sixfold of that of the reference sample.

Figure 7:
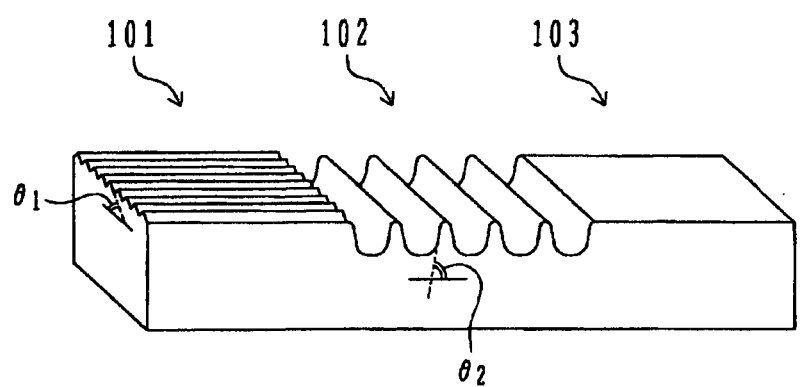
FIG. 7 is a perspective view showing a surface pattern of a nitride semiconductor light emitting device according to a second embodiment.

FIG. 7 is a perspective view showing the texture of an active layer of the second embodiment. The active layer of the nitride semiconductor light emitting device of the second embodiment is formed to have areas of different texture, as shown in FIG. 7.

Specifically, the light emitting device shown in FIG. 7 has three light emitting regions 101, 102 and 103 having different light emission wavelength ranges.

The light emitting region 103 has a flat active layer like the reference sample of the first embodiment. Nitride semiconductor crystal of the light emitting region has a composition different from that of the reference sample. In this embodiment, the composition is adjusted to obtain optical emission in the green light emission range (500 nm to 540 nm).

The first nitride semiconductor layer 2 is etched by using a resist etching mask patterned in a shape similar to that of FIG. 5, to form the light emitting regions 101 and 102 having rib-like smooth stripe surface textures disposed periodically and having maximum inclination angles of $\theta_1$ and $\theta_2$ along a-axis and M-axis directions, respectively.

The light emitting region 101 has the active layer having the surface angle distribution along the a-axis direction. The distribution range of inclination angles along the a-axis direction is 0° to 3°. The light emitting region 101 provides the light emitting layer having a blue light emission range (440 nm to 500 nm).

The light emitting region 102 has the active layer having the surface angle distribution along the M-axis direction. The distribution range of inclination angles along the M-axis direction is 0° to 30°. The light emitting region 102 provides the light emitting layer having a red light emission range (540 nm to 640 nm).

These light emitting regions 101 to 103 are formed by performing resist-etching twice (one for the light emitting region 101 and the other for the light emitting region 102), and juxtaposed as shown in FIG. 7. It is expected that a nitride semiconductor light emitting device is realized having a light emission wavelength range (440 nm to 640 nm) near the whole visible light range.

Other manufacture processes are similar to those of the first embodiment.

The surface pattern of each light emitting region is not limited to a set of ridges, but may be the pattern as shown in FIGS. 4A to 4C.

As described so far, by using the nitride semiconductor light emitting device of the embodiments, light emission of good color rendering can be obtained having a light emission wavelength spectrum distribution near the visible light range.

The present invention has been described in connection with the preferred embodiments. The invention is not limited only to the above embodiments. For example, positive type resist may be used as the photoresist 3 by properly adjusting an exposure amount, mask metal pattern 8m and the like. For more example, inclination angle may be 0° to 30° along a-axis direction, and 0° to 90° along M-axis direction, depended on the light emission wavelength range.

It will be apparent to those skilled in the art that other various modifications, improvements, combinations, and the like can be made.

What is claimed is:

1. A method for manufacturing a nitride semiconductor light emitting device, the method comprising:
    forming a resist pattern on a first nitride semiconductor layer formed above a substrate, wherein said resist pattern has a plurality of projections, wherein adjacent ones of said projections are continuous with each other, and wherein an inclination angle of an upper surface of said resist pattern relative to a substrate surface changes smoothly between said adjacent projections;
    etching said first nitride semiconductor layer by using said resist pattern as a mask to transfer said resist pattern to said first nitride semiconductor layer; and
    forming an active layer on said patterned first nitride semiconductor layer;
    wherein said active layer includes a multiple quantum well structure including a plurality of well layers, and wherein a maximum inclination angle of an upper surface of a lower well layer is steeper than a maximum inclination angle of an upper well layer.

2. The method according to claim 1, wherein said projections are disposed in a hexagonal close-packed configuration.

3. The method according to claim 1, wherein said projections are rib-like stripes.

4. The method according to claim 1, wherein an inclination angle of an upper surface of said first nitride semiconductor layer changes in a range of 0° to 30° after said etching of said first nitride semiconductor layer,
    wherein said active layer contains GaN, and includes a first region and a second region, and
    wherein an inclination angle along an a-axis direction of an upper surface of said first region changes in a range of 0° to 3°, and inclination angle along an m-axis direction of an upper surface of said second region changes in a range of 0° to 30°.

5. The method according to claim 1, wherein forming the resist pattern comprises:
    coating a resist layer on said first nitride semiconductor layer; and
    radiating light on said resist layer by using proximity exposure and developing said resist layer to form said resist pattern.

6. The method for manufacturing a nitride semiconductor light emitting device according to claim 5, wherein said active layer includes an n-type nitride semiconductor layer, a p-type nitride semiconductor layer, and a plurality of light emitting regions having different light emission wavelength ranges.

7. The method according to claim 6, wherein said inclination angle is from 0° to 90°.

8. A method for manufacturing a nitride semiconductor crystal, the method comprising:
   forming a resist pattern on a first nitride semiconductor layer formed above a substrate, wherein said resist pattern has a plurality of projections, wherein adjacent ones of said projections are continuous with each other, and wherein an inclination angle of an upper surface of said resist pattern relative to a substrate surface changes smoothly between said adjacent projections;
   etching said first nitride semiconductor layer by using said resist pattern as a mask to transfer said resist pattern to said first nitride semiconductor layer; and
   forming an active layer on said patterned first nitride semiconductor layer;
   wherein said active layer includes a multiple quantum well structure including a plurality of well layers, and wherein a maximum inclination angle of an upper surface of a lower well layer is steeper than a maximum inclination angle of an upper well layer.

9. The method according to claim 8, wherein forming the resist pattern comprises:
   coating a resist layer on said first nitride semiconductor layer; and
   radiating light on said resist layer by using proximity exposure and developing said resist layer to form said resist pattern.

10. The method according to claim 9, wherein said active layer includes an n-type nitride semiconductor layer, a p-type nitride semiconductor layer, and a plurality of light emitting regions having different light emission wavelength ranges.

\* \* \* \* \*